United States Patent
Chen

(10) Patent No.: US 7,505,271 B2
(45) Date of Patent: Mar. 17, 2009

(54) HEAT SINK MOUNT

(75) Inventor: Win-Haw Chen, Taipei (TW)

(73) Assignee: Inventec Corporation (TW)

( * ) Notice: Subject to any disclaimer, the term of this patent is extended or adjusted under 35 U.S.C. 154(b) by 588 days.

(21) Appl. No.: 11/343,640

(22) Filed: Jan. 30, 2006

(65) Prior Publication Data

US 2007/0030652 A1 Feb. 8, 2007

(30) Foreign Application Priority Data

Aug. 3, 2005 (TW) .............................. 94213190 U

(51) Int. Cl.
*H05K 7/20* (2006.01)
(52) U.S. Cl. .................. 361/704; 257/718; 257/719; 24/458; 165/80.3
(58) Field of Classification Search .................. None
See application file for complete search history.

(56) References Cited

U.S. PATENT DOCUMENTS

| | | | | |
|---|---|---|---|---|
| 6,449,157 B1 * | 9/2002 | Chu | ............................ | 361/704 |
| 6,822,864 B2 * | 11/2004 | Huang et al. | ................ | 361/697 |
| 7,161,805 B2 * | 1/2007 | Gattuso et al. | .............. | 361/704 |
| 7,180,746 B2 * | 2/2007 | Yu et al. | ...................... | 361/719 |
| 7,327,575 B2 * | 2/2008 | Yu et al. | ...................... | 361/719 |
| 7,349,217 B2 * | 3/2008 | Hashimoto | .................. | 361/719 |
| 7,362,581 B2 * | 4/2008 | Chen | .......................... | 361/709 |
| 7,430,121 B2 * | 9/2008 | Lu et al. | ...................... | 361/719 |
| 2008/0173426 A1 * | 7/2008 | Yan | .......................... | 165/80.3 |

FOREIGN PATENT DOCUMENTS

| | | |
|---|---|---|
| TW | 483657 | 11/1984 |
| TW | 456586 | 6/1989 |
| TW | 564010 | 4/1990 |

* cited by examiner

*Primary Examiner*—Boris L Chervinsky
(74) *Attorney, Agent, or Firm*—Peter F. Corless; Steven K. Jensen; Edwards Angell Palmer & Dodge LLP

(57) ABSTRACT

A heat sink mount including a body, a first operating member, and two second operating members is provided. The body is formed with a first side, a second side opposite to the first side, a third side connecting the first side and the second side, and a fourth side opposite to the third side and connecting the first side and the second side. One end of the first operating member is pivotally attached to the first side of the body, and the other end thereof is rotatably coupled to the second side of the body. The first operating member further includes a second positioning portion and a third positioning portion. Each of the second operating members is pivotally attached to the third side and the fourth side of the body respectively and fixed in position by the second positioning portion and the third positioning portion respectively.

15 Claims, 5 Drawing Sheets

HEAT SINK MOUNT

BACKGROUND OF THE INVENTION

1. Field of the Invention

The present invention relates to heat sink mounts, and more particularly, to a heat sink mount for mounting at least two heat sinks.

2. Description of the Related Art

As electronic products are preferred to be light in weight, small in size, thin in thickness, speeds thereof are also required to be faster on a generational base. To achieve the requirement of faster processing speeds, as a critical part of the electronic products such as a computer, an electronic device such as a central processor unit (CPU) for operating and executing primary controlling functions are getting more and more important. Besides, since the density of electronic device in an electronic product such as a computer is getting dense and an extreme amount of heat will be generated during a high frequency operation of a CPU and become a potential issue of disabling the computer system, a heat dissipating issue has become the most critical bottleneck for overcoming technical issues such as reliability and lifetime of electronic products.

In order to efficiently remove the extreme amount of heat from a CPU, a heat dissipation device such as a heat sink is usually provided near the CPU. For example, a heat sink is directly folded on a circuit board having a CPU via a connecting pillar to dissipate the extreme amount of heat from the CPU. Related prior patents include Taiwanese Utility Model Patent No. 456586, Taiwanese Utility Model Patent No. 483657, Taiwanese Utility Model Patent No. 564010, etc.

Referring to FIG. 1, Taiwanese Utility Model Patent No. 456586 discloses a method of folding a heat sink 100 to a CPU 30 mounted on a CPU socket 20 via a clip 10. The clip 10 includes a pressing portion 101, two locking portions 103, and two locking holes 105. Wherein the pressing portion 101 bends downwardly, each of the locking portions 103 extends outwardly and upwardly from opposite ends of the pressing portion 101 and then bends downwardly, and each of the locking holes 102 is defined in a distal end of each of the locking portions 103. Thus, each of the locking holes 105 can engagingly receive one of corresponding catches 201 formed on a side of the CPU socket 20 to assemble the heat sink 100, the CPU 30 and the CPU socket 20 mounted on a printed circuit board (not shown).

However, to assemble or disassemble the conventional clip 10, specific tools would be required to lock the locking holes 105 of the clip 10 to the corresponding catches 201 of the CPU socket 20 or to release the locking status between the clip 10 and the CPU socket 20. Therefore, the conventional technology is really not convenient in practical using.

Besides, to lock the clip 10 on the CPU socket 20 will result in unbalanced pressing of both ends of the heat sink 100, the heat sink 100 therefore can not be firmly attached to the CPU 30 provided over the CPU socket 20 and the heat dissipating efficiency will be decreased. Furthermore, the above inextricable and complicated assembling steps also result in problems of time-consuming and requiring strenuous effort in practical using.

Further referring to Taiwanese Utility Model Patent No. 483657, two sets of mounting devices including heat sink mounts and pressing strips pivotally attached to one of the distal ends of each of the heat sink mounts are provided to mount a heat sink to dissipate heat from electronic devices (e.g. CPU). Each of the heat sink mounts includes a main body capable of providing on one side of the heat sink, a pivot hole catch and a locking slot provided on opposite distal ends thereof. Each of the pressing strips is formed with elastic strips of predetermined bending structure, and a central region thereof is bent 90 degrees to form a recessed portion having a ladder-shaped protruding member.

However, when using the conventional technology, in order to engage a free end of the pressing strip in the locking slot of the heat sink mount and to bury the central recessed portion of the pressing strip into an edge groove on a bottom surface of the heat sink, the printed circuit board must save a larger space for allowing the pressing strip to turn around. Thus, the overall volume of the electronic product would be increased and does not comply with the compact requirement of electronic products. Furthermore, if there is no enough space for allowing the pressing strip to turn around, the pressing strip will generate an interfering problem during turning and result in difficulty of assembling and disassembling. Therefore, except for a waste in space in the conventional technology, it is really not convenient to disassemble within a limited space inside the electronic product.

Besides, in order to enhance functions and processing speeds of electronic products, nowadays two CPUs are generally used in an electronic product such as a computer. Thus, applying to the above conventional technology, four symmetric sets of mounts and pressing strips would be needed, which requires a relative large space and unfavorable in satisfying the compact requirement of electronic products.

Further referring to Taiwanese Utility Model Patent No. 564010, a heat sink mount composed by a mount and two resilient crossbeams is provided to mount a heat sink dissipating heat from an electronic product such as a CPU by a mounting device. One distal end of each of the resilient crossbeams is pivotally attached to a pivot hole of the mount, and the other end is capable of locking and positioning in a locking slot of the mount. When the heat sink mount is not in use, the resilient crossbeams can be spun inwardly to reach a bottom surface of the heat sink; and when in use, they can be spun to stand and firmly press a central resilient pressing portion to two edge shoulders or other selected positions of the heat sink so as to form a stable locking status.

However, though the space-wasting and interfering defects set forth in the Taiwanese Utility Model Patent No. 483657 can be solved by the above patent, there is still a problem in requiring a larger space for satisfying a compact requirement in a dual-CPU electronic product.

Besides, in the above Taiwanese Utility Model Patent No. 483657 and the above Taiwanese Utility Model Patent No. 564010 applied in a dual-CPU electronic product, heat sinks need to be provided on corresponding or symmetrical structures, which would increase production costs and unfavorable in production. Therefore, there is still improvement needed.

Accordingly, to solve all kinds of defects in the above conventional technology by providing a design of shrinking occupied space, easy in assembling and disassembling, time-saving and effort-saving, low cost, and enhancing heat dissipating efficiency subjected to effectively using the interior space of an electronic product has become an urgent obstacle in the industry.

SUMMARY OF THE INVENTION

In view of the above defects of the conventional technology, an objective of the present invention is to provide a heat sink mount capable of reducing the occupied space thereof, so as to provide effects of easy in assembling and disassembling subjected to effectively use the interior space of an electronic product.

Another objective of the present invention is to provide a heat sink mount capable of saving time and efforts.

Still another objective of the present invention is to provide a heat sink mount capable of saving production costs.

A further objective of the present invention is to provide a heat sink mount capable of enhancing heat dissipating efficiency.

In accordance with the above and other objectives, the present invention proposes a heat sink mount including: a body having a first side, a second side opposite to the first side, a third side connecting the first side and the second side, and a fourth side opposite to the third side and connecting the first side and the second side; a first operating member having one end pivotally attached to the first side of the body, and having the other end rotatably coupled to the second side of the body, the first operating member including a second positioning portion and a third positioning portion; and two second operating members pivotally attached to the third side and the fourth side of the body respectively and fixed in position by the second positioning portion and the third positioning portion respectively.

Preferably, the body has a frame structure. The body is of a shape of two rectangles connected together and is preferably integrally formed. The body further comprises a plurality of first positioning portions and a first locking portion, wherein each of the first positioning portions is a pillar, and the first locking portion is externally coupled to the second side of the body and has a structure of locking post or other equivalent structure. The first operating member is formed with a pivot portion mounted to the first side of the body, a crossbeam portion pivotally attached to the pivot portion, and a second locking member pivotally attached to the crossbeam portion, wherein the second locking member has a structure of locking hook or other equivalent structure. The second positioning portion and the third positioning portion of the first operating member are provided in a central area of the crossbeam portion. Each of the second operating members is a resilient positioning member preferably made of an elastic material, and is a pressing strip having a shape selected from the group consisting of circular, flat, oval, rectangular and waved shape. Each of the second operating members further comprises at least one pressing portion having a structure partially bent downwardly from opposite ends of each of the second operating members toward a central position thereof.

Comparing to the conventional technology, the heat sink mount of the present invention achieves the effect of saving layout space by providing a body that is integrally formed and capable of mounting heat sinks to dissipate heat from two electronic products (e.g. dual CPU), and achieves the effect of saving operation space by providing the first operating member and the second operating member. Accordingly, the present invention overcomes the defect of incapable of shrinking the layout and operation space limited by structure in the conventional technology. Therefore, the present invention provides effects of easy in assembling and disassembling subjected to effectively use the interior space of an electronic product.

Besides, both the first operating member designed according to a leverage theory and the resilient second operating members of the present invention are easy to be assembled and disassembled, which prevents the present invention from the problems of time-consuming and requiring strenuous effort in practical using resulted from the inextricable and complicated assembling steps in the conventional technology. Furthermore, the present invention can be assembled and disassembled without specific tools. Thus, the present invention provides the user with the effects of saving time and efforts during application such that enhance the convenience in practical using.

In addition, the present invention solves the problems of increasing production costs and unfavorable in production resulted from providing corresponding or symmetrical structures to heat sinks in the conventional technology by providing a single frame for mounting heat sinks dissipating heat from two electronic products, so as to reduce production costs and simplify procedures of mounting heat sink mount of the present invention on the printed circuit board.

Furthermore, by providing the first operating member and the second operating members to uniformly press the heat sinks, the heat sink mount of the present invention can prevent the inefficient heat removal defect resulted from unbalanced locking both ends of the heat sink to the CPU socket by the clip and unavailable to firmly fold the heat sink on the printed circuit board having pre-configured CPU in the conventional technology, and can enhance relative heat dissipating efficiency.

Therefore, the heat sink mount of the present invention can solve all kinds of defects in the above conventional technology by providing effects of shrinking occupied space, easy in assembling and disassembling, time-saving and effort-saving, low cost, and enhancing heat dissipating efficiency subjected to effectively using the interior space of an electronic product, such that has really high industrial capability.

The examples of the present invention are illustrated with the following specific embodiments, and a person skilled in the art can easily realize the advantages and effectiveness of the present invention according to the disclosed contents in the specification. The present invention may be executed or applied with other different embodiments, and any details in the specification may be modified or varied based on different points of view and applications without departing from the spirit of the present invention.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

Figure 1:
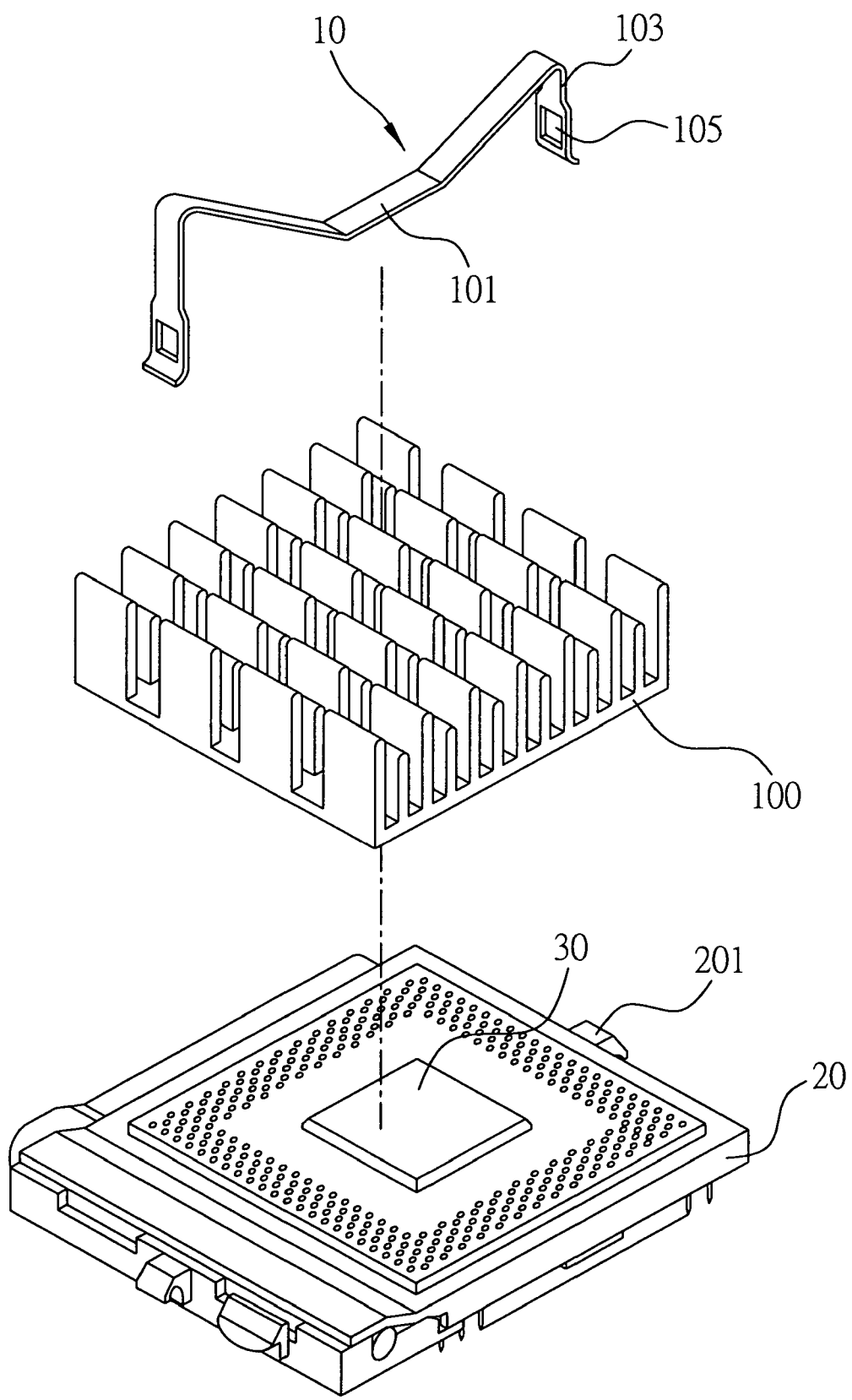
FIG. 1 (PRIOR ART) is an exploded view of a conventional structure for mounting a heat sink to an electronic product.

The preferred embodiment of a heat sink mount proposed in the present invention is described as follows with reference to FIGS. 2 to 5. It should be noted that these drawings are simplified schematic diagrams showing only components related to the present invention, and the heat sink mount is not limited to the components shown in the drawings. The arrangement of components of the heat sink mount can be modified according to the design and may be more complicated in practice.

FIGS. 2 through 5 are structural views of the preferred embodiment in accordance with the heat sink mount of the present invention. The following preferred embodiment of the present invention is illustrated by an example capable of mounting at least one heat sink on a printed circuit board, so as to dissipate heat from an electronic product such as a CPU mounted thereon; however, it should not be limited for this embodiment. Besides, since the conventional electronic products, printed circuit boards, and heat sinks can be used without changing in the structures, only the structures directly related to the present invention are shown in the figures and the rest of them are omitted to simplify and further clarify the features and the structures of the present invention.

Figure 2:
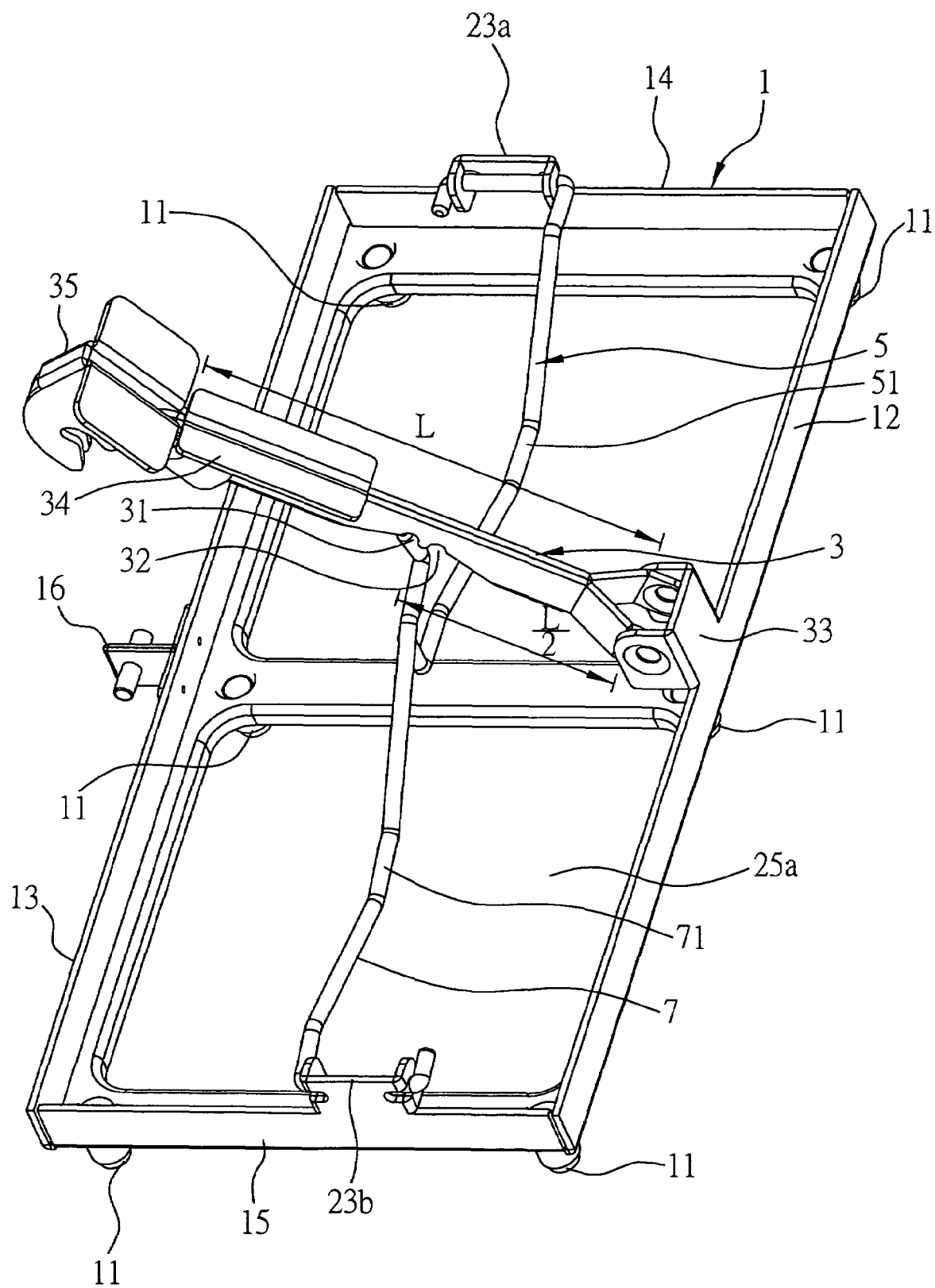
FIG. 2 is a structural view of a heat sink mount according to a preferred embodiment of the present invention.

Referring to FIG. 2, the heat sink mount disclosed by the present embodiment includes a body 1, a first operating member 3, and two second operating members 5 and 7. The heat sink mount disclosed by the present embodiment is, but not limited to, capable of mounting two heat sinks (not shown in the figure).

The body 1 is provided with a plurality of first positioning portions 11 for mounting electronic products on a printed circuit board (not shown in FIG. 2). The body 1 further includes a first side 12; a second side 13 opposite to the first side 12; a third side 14 connecting the first side 12 and the second side 13; a fourth side 15 opposite to the third side 14 and connecting the first side 12 and the second side 13; and a first locking portion 16 externally coupled to the second side 13. The first locking portion 16 is of a structure of locking post. The body 1 has a frame structure such as a structure having a shape of two rectangles connected together, or other equivalent structure. And to provide better mounting effect, the body 1 is preferably integrally formed and capable of mounting two heat sinks to dissipate heat from two electronic products (e.g. dual CPU), so as to achieve the effects of increasing strength and saving space. Each of the first positioning portions 11 is preferably a pillar. Since it is a generally known technique to mount the body 1 to a printed circuit board by the first positioning portions 11 such as pillars, it is not going to be further described.

The first operating member 3 has one end pivotally attached to the first side 12 of the body 1 and has the other end rotatably coupled to the second side 13 of the body 1. The first operating member 3 includes a second positioning portion 31 and a third positioning portion 32. Besides, the first operating member 3 is optionally formed with a pivot portion 33 mounted to the first side 12 of the body 1, a crossbeam portion 34 pivotally attached to the pivot portion 33, and a second locking member 35 pivotally attached to the crossbeam portion 34. The second positioning portion 31 and the third positioning portion 32 are provided substantially in a central area of the crossbeam portion 34. The second locking member 35 corresponds to the first locking portion 16 of the body 1 and has a structure of locking hook or other equivalent structure. It should be noted that the structures of the second locking portion 35 and the first locking portion 16 should not be limited to the disclosures of the present embodiment and any equivalent structures capable of correspondingly combining the body 1 and the first operating member 3 can be applied to the present invention.

Figure 3:
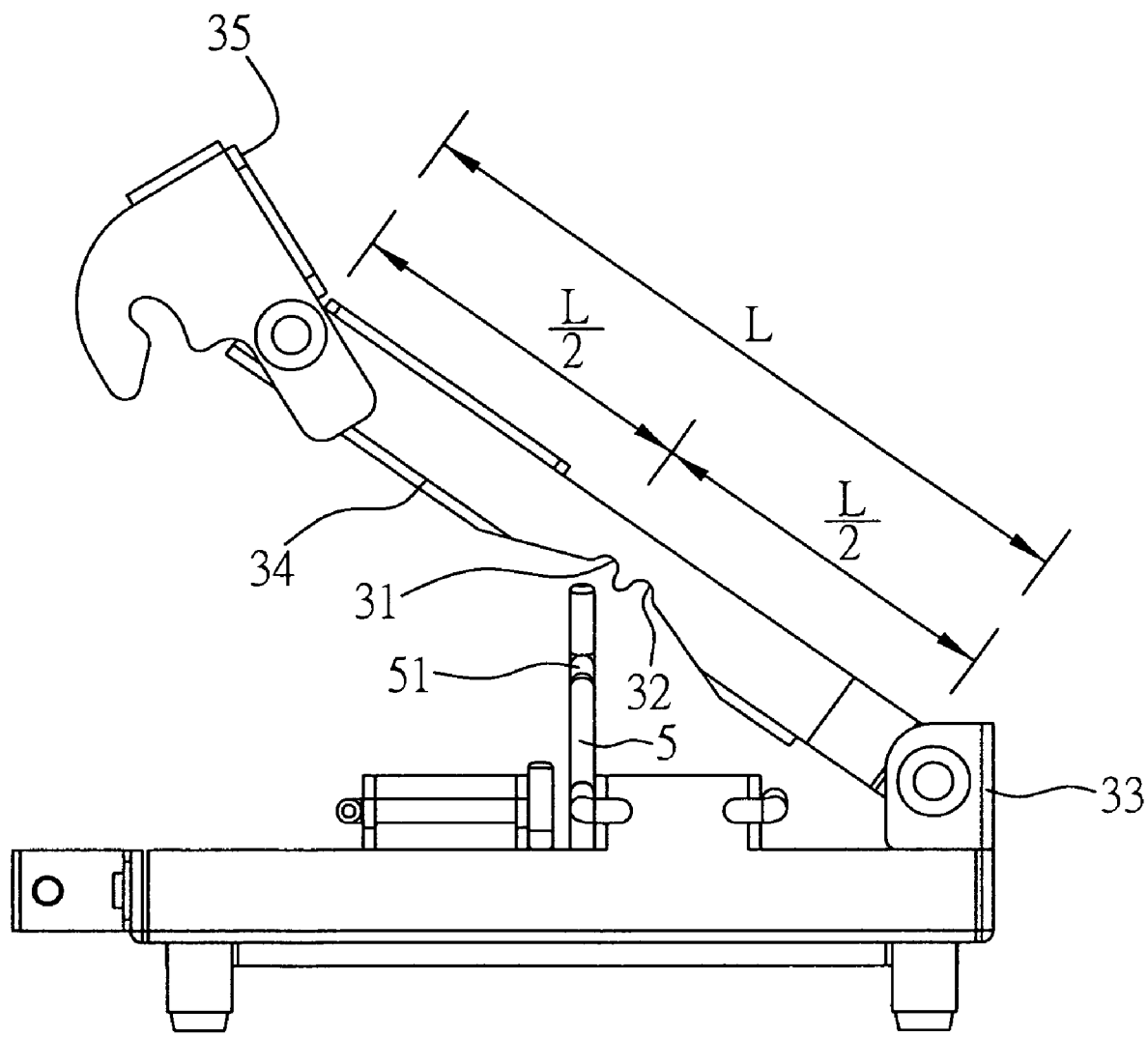
FIG. 3 is a side view showing one side of the heat sink mount of FIG. 2.

The second operating members 5, 7 is pivotally attached to the third side 13 and the fourth side 15 of the body 1 respectively and fixed in position by the second positioning portion 31 and the third positioning portion 32 respectively. As shown in FIG. 2, each of the second operating members 5, 7 is a resilient positioning member preferably made of an elastic material such as circular pressing strips and further comprises at least one pressing portion 51, 71. Each of the pressing portions 51, 71 has a structure partially bent downwardly from opposite ends of each of the second operating members 5, 7 toward a central position thereof, such that each of the second operating members 5, 7 can be pressed by the second positioning portion 31 and the third positioning portion 32 of the first operating member 3 (for example, FIG. 3 shows that the second positioning portion 31 can press the pressing portion 51 of the second operating member 5). Each of the pressing portions 51, 71 can press the heat sink and uniformly distribute the pressure on the heat sink via each of the operating members 5, 7.

In addition, it should be noted that the objective of designing each of the operating members 5, 7 is to mount at least one heat sink to dissipate heat from the electronic product. For example, the structure of each of the operating members 5, 7 in the figures can be a circular pressing strip that is capable of pressing the heat sink shown in FIG. 1 of the prior art. This however does not set a limitation on the shape of the strip, and those skilled in the art can modify the shape of the strip each of the operating members 5, 7 to flat, oval, rectangular, waved shape, or other equivalent shapes applying to heat sinks of the same or different structures.

Referring to FIG. 3, when the pivot portion 33 is defined as a pivot, the length of the crossbeam portion 34 is L, the length between the pivot portion 33 and the second positioning portion 31 provided in the roughly central region of the crossbeam portion 34 is L/2, and the length between the second locking portion 35 and the third positioning portion 32 provided in the roughly central region of the crossbeam portion 34 is also L/2.

Thus, according to a leverage theory, the length L of the crossbeam portion 34 (i.e. lever of force) is twice of the length between the second positioning portion 31 and the third positioning portion 32, such that the second positioning portion 31 and the third positioning portion 32 can easily use half of the strength to press each of the second operating members 5, 7. Furthermore, applying a leverage theory, the second locking portion 35 can easily lock to the first locking portion 16 of the body 1 by using the crossbeam portion 34 as a pivot. Besides, since the objective of designing the first operating member 3 is to mount at least one heat sink to dissipate heat from the electronic product, the first operating member 3 upwardly provided in the figures can provide a firmly positioning effect by falling the second locking portion 35 with gravity and it is not necessary to add other mounting structures.

Certainly, to stop possible slip, the second locking portion 35 can be further fixed by other positioning devices in other embodiments. However, the modification should be apparent to those skilled in the art that it is not further described with figures. Besides, a leverage theory is a conventional technology that it will not be illustrated.

Figure 4:
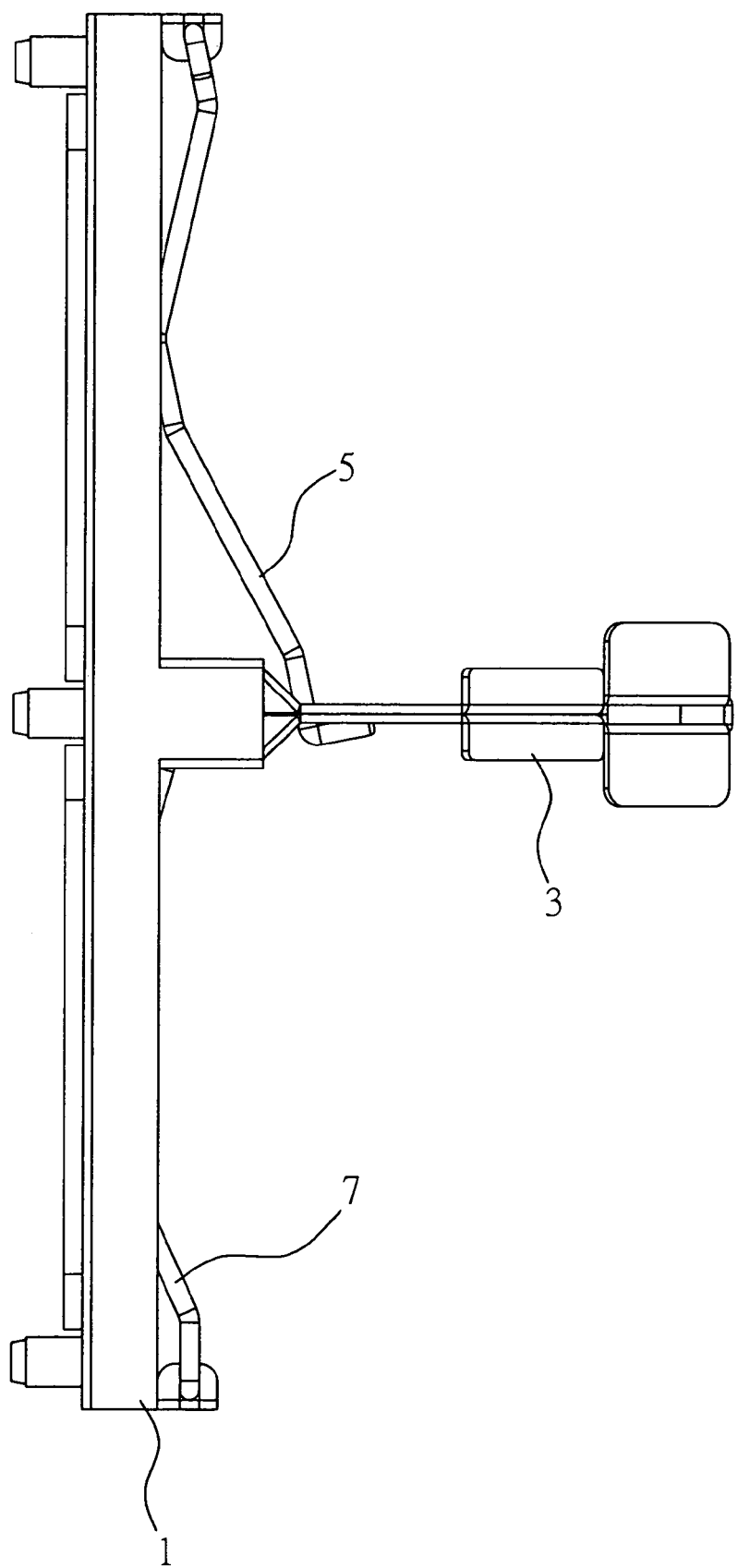
FIG. 4 is a side view of the heat sink mount of FIG. 2 in an unused status.

Referring to FIG. 4, when the heat sink is not provided inside the body 1 and the heat sink mount is not folded on the printed circuit board having the electronic product (not shown), the first operating member 3 can remain standing without pressing each of the second operating members 5, 7. Thus, the heat sink can be mounted to the body 1 by the user prior to mounting the heat sink mount to the printed circuit board having the electronic product via the first positioning portions 11. Certainly, it is also available to mount the heat sink mount to the printed circuit board having the electronic product via the first positioning portions 11 prior to mounting the heat sink to the body 1, which is not limited by the embodiment.

When the heat sinks are mounted to the body 1 and the heat sink mount is mounted to the printed circuit board having the electronic product, the first operating member 3 can be press down to press each of the second operating members 5, 7. Thus, the heat sinks can be mounted on an upper surface of the electronic product to dissipate heat via the first operating member 3 and the second operating members 5 and 7 of the heat sink mount without using specific tools. In that case, the second operating members 5 and 7 pressed by the first operating member 3 are resilient. When the heat sinks are to be disassembled, releasing the locking status between the second locking portion 35 and the first locking portion 16, the first operating member 3 can be easily pushed upwardly using the resilient force of the second operating members 5 and 7 without specific tools.

Figure 5:
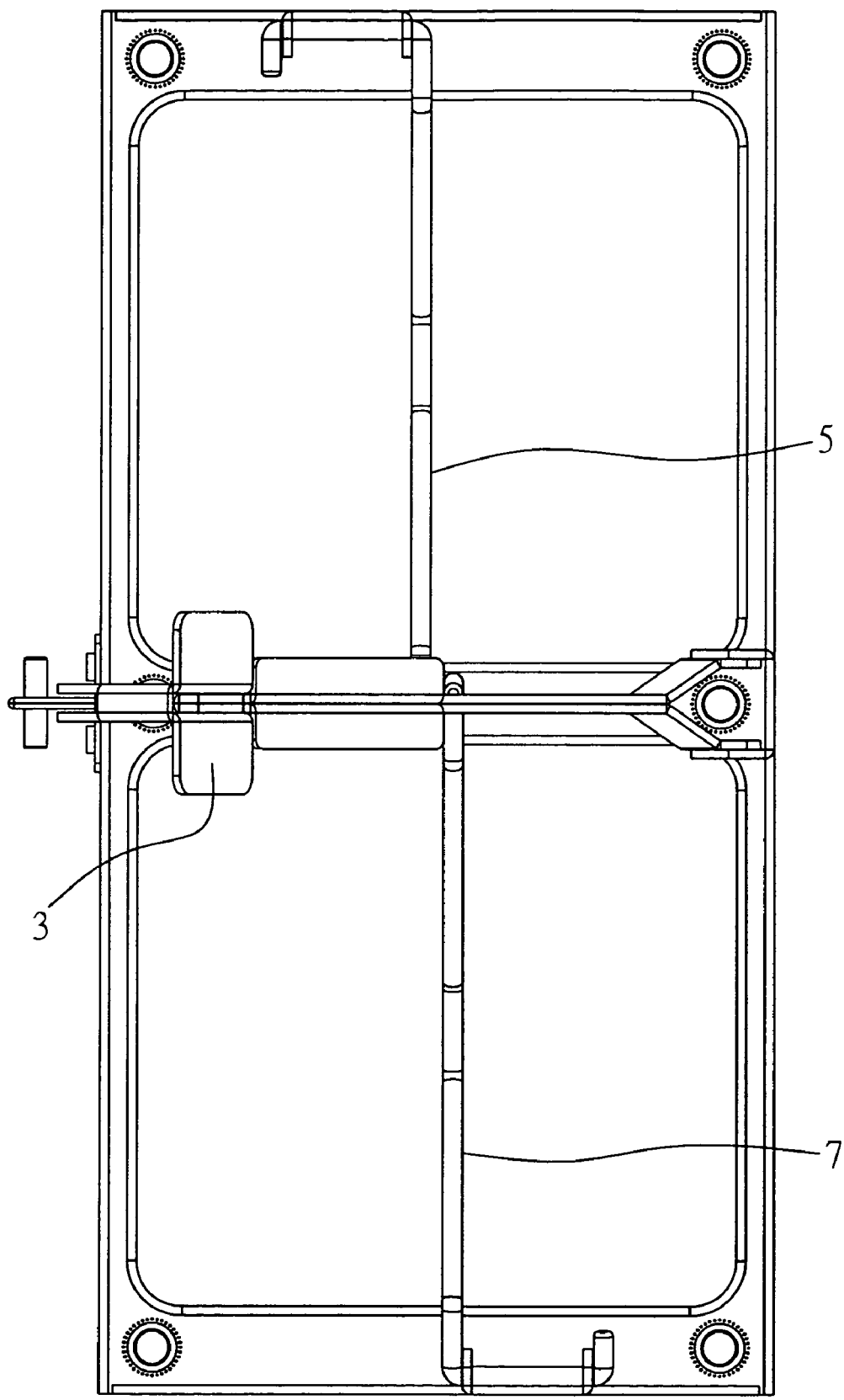
FIG. 5 is a top view of the heat sink mount of FIG. 2 in the unused status.

Besides, if the heat sink mount is not in use, as shown in FIG. 5, the first operating member 3 can also be pressed down to save required volume of packaging the heat sink mount. It should be noted that the heat sink mount of FIG. 5 is not pressed by the second operating members 5 and 7 via the first operating member 3; certainly, but not to be limited, it can be packaged after pressing by the second operating members 5 and 7 via the first operating member 3.

Comparing to conventional technology, the present invention provides the single body 1 to mount the heat sinks of dual CPU and the first operating member 3 to mount the heat sinks on the printed circuit board having dual CPU by pressing the second operating members 5 and 7. Thus, the present invention can not only provide larger space for turning and prevent from the interfering problem during turning, but also overcome the defect of incapable of shrinking the occupied space limited for the structures in the conventional technology. Therefore, the present invention provides a heat sink mount capable of shrinking occupied space, so as to provide effects of easy in assembling and disassembling subjected to effectively use the interior space of an electronic product.

In addition, the first operating member 3 of the present invention is designed with a leverage theory such that it can be installed by easy and effort-saving operations, and each of the operating members 5, 7 will generate resilient force during pressing by the first operating member 3 such that it can be easily assembled or disassembled without tools. Therefore, comparing to conventional technology, the heat sink mount of the present invention can provide timesaving and effort-saving effects during assembling or disassembling.

Furthermore, the present invention can not only overcome the defect of incapable of shrinking the occupied space limited for the structures in the conventional technology, but also lower production costs by eliminating corresponding or symmetrical structures provided for mounting heat sinks in the conventional technology. Besides, since uniform pressure is applied to the entire heat sink by combining the first operating member 3 and the second operating members 5 and 7, the problem resulted from unbalanced pressing on both ends of the heat sink by using the clip in the conventional technology can be solved, so as to enhance the heat dissipating efficiency.

Therefore, the heat sink mount incapable of shrinking the occupied space of the present invention can solve all kinds of defects in the above conventional technology by providing effects of shrinking occupied space, easy in assembling and disassembling, time-saving and effort-saving, low cost, and enhancing heat dissipating efficiency subjected to effectively using the interior space of an electronic product, such that has really high industrial capability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A heat sink mount comprising:
a body having a first side, a second side opposite to the first side, a third side connecting the first side and the second side, and a fourth side opposite to the third side and connecting the first side and the second side;
a first operating member having one end pivotally attached to the first side of the body, and having the other end rotatably coupled to the second side of the body, the first operating member including a second positioning portion and a third positioning portion; and
two second operating members pivotally attached to the third side and the fourth side of the body respectively and fixed in position by the second positioning portion and the third positioning portion respectively.

2. The heat sink mount of claim 1, wherein the body has a frame structure.

3. The heat sink mount of claim 1, wherein the body has a shape of two rectangles connected together.

4. The heat sink mount of claim 1, wherein the body is integrally formed.

5. The heat sink mount of claim 1, wherein the body further comprises a plurality of first positioning portions and a first locking portion.

6. The heat sink mount of claim 5, wherein each of the first positioning portions is a pillar.

7. The heat sink mount of claim 5, wherein the first locking portion is externally coupled to the second side of the body.

8. The heat sink mount of claim 5, wherein the first locking portion is a locking post.

9. The heat sink mount of claim 1, wherein the first operating member further comprises a pivot portion mounted to the first side of the body, a crossbeam portion pivotally attached to the pivot portion, and a second locking member pivotally attached to the crossbeam portion.

10. The heat sink mount of claim 9, wherein the second positioning portion and the third positioning portion are provided in a central area of the crossbeam portion.

11. The heat sink mount of claim 9, wherein the second locking portion has a locking hook structure.

12. The heat sink mount of claim 1, wherein each of the second operating members is made of an elastic material.

13. The heat sink mount of claim 1, wherein each of the second operating members is a pressing strip having a shape selected from the group consisting of circular, flat, oval, rectangular and waved shape.

14. The heat sink mount of claim 1, wherein each of the second operating members comprises at least one pressing portion.

15. The heat sink mount of claim 14, wherein the pressing portion has a structure partially bent downwardly from opposite ends of each of the second operating members toward a central position thereof.

* * * * *